United States Patent [19]

Caldwell

[11] Patent Number: 4,994,890
[45] Date of Patent: Feb. 19, 1991

[54] RECTIFIER STRUCTURE WITH INDIVIDUAL LINKS

[75] Inventor: Donald J. Caldwell, Milwaukee, Wis.

[73] Assignee: Snap-on Tools Corporation, Kenosha, Wis.

[21] Appl. No.: 441,706

[22] Filed: Nov. 27, 1989

[51] Int. Cl.$^5$ .................. H01L 27/02; H01L 23/16; H01L 23/42

[52] U.S. Cl. ...................... 357/51; 357/74; 357/75; 357/79

[58] Field of Search .................. 357/51, 74, 75, 76, 357/77, 79

[56] References Cited

U.S. PATENT DOCUMENTS

| | | |
|---|---|---|
| 3,226,603 | 12/1965 | Finn, Jr. et al. .................. 357/51 |
| 3,231,794 | 1/1966 | Diebold . |
| 3,489,960 | 1/1970 | Hudman . |
| 3,611,107 | 10/1971 | Ruckel .................. 357/51 |
| 3,665,287 | 5/1972 | Cross et al. . |
| 3,719,862 | 3/1973 | Gaicki . |
| 3,723,836 | 3/1973 | Shekerjian et al. . |
| 3,925,809 | 12/1975 | Striker . |
| 3,936,704 | 2/1976 | Brenneman et al. . |
| 3,959,676 | 5/1976 | Striker . |
| 4,047,197 | 9/1977 | Schierz . |
| 4,499,485 | 2/1985 | Schierz et al. . |
| 4,504,850 | 3/1985 | Pollard et al. . |
| 4,554,574 | 11/1985 | Wright .................. 357/51 |
| 4,604,643 | 8/1986 | Yotsumoto et al. . |
| 4,646,131 | 2/1987 | Amagasa et al. . |
| 4,672,422 | 6/1987 | Schierz . |
| 4,694,322 | 9/1987 | Sakurai et al. . |
| 4,731,644 | 3/1988 | Neidig . |
| 4,809,057 | 2/1989 | Ocken . |
| 4,835,427 | 5/1989 | Bohm et al. . |

*Primary Examiner*—J. Carroll
*Attorney, Agent, or Firm*—Emrich & Dithmar

[57] ABSTRACT

The rectifier structure comprises a plurality of diodes including opposed first and second terminals. A plate electrically connects the first terminals to one another. A retainer locates the diodes on the plate. A plurality of individual links including an outer end portion, an inner end portion, and a fuse portion therebetween are located on the retainer such that the outer end portion of each link is in contact with the second terminal of a respective diode. A washer is in contact with the inner end portion of each link for electrically connecting the second terminals to one another. The links provide fuses for disconnecting the diodes from the washer when excessive current flows through a diode.

25 Claims, 2 Drawing Sheets

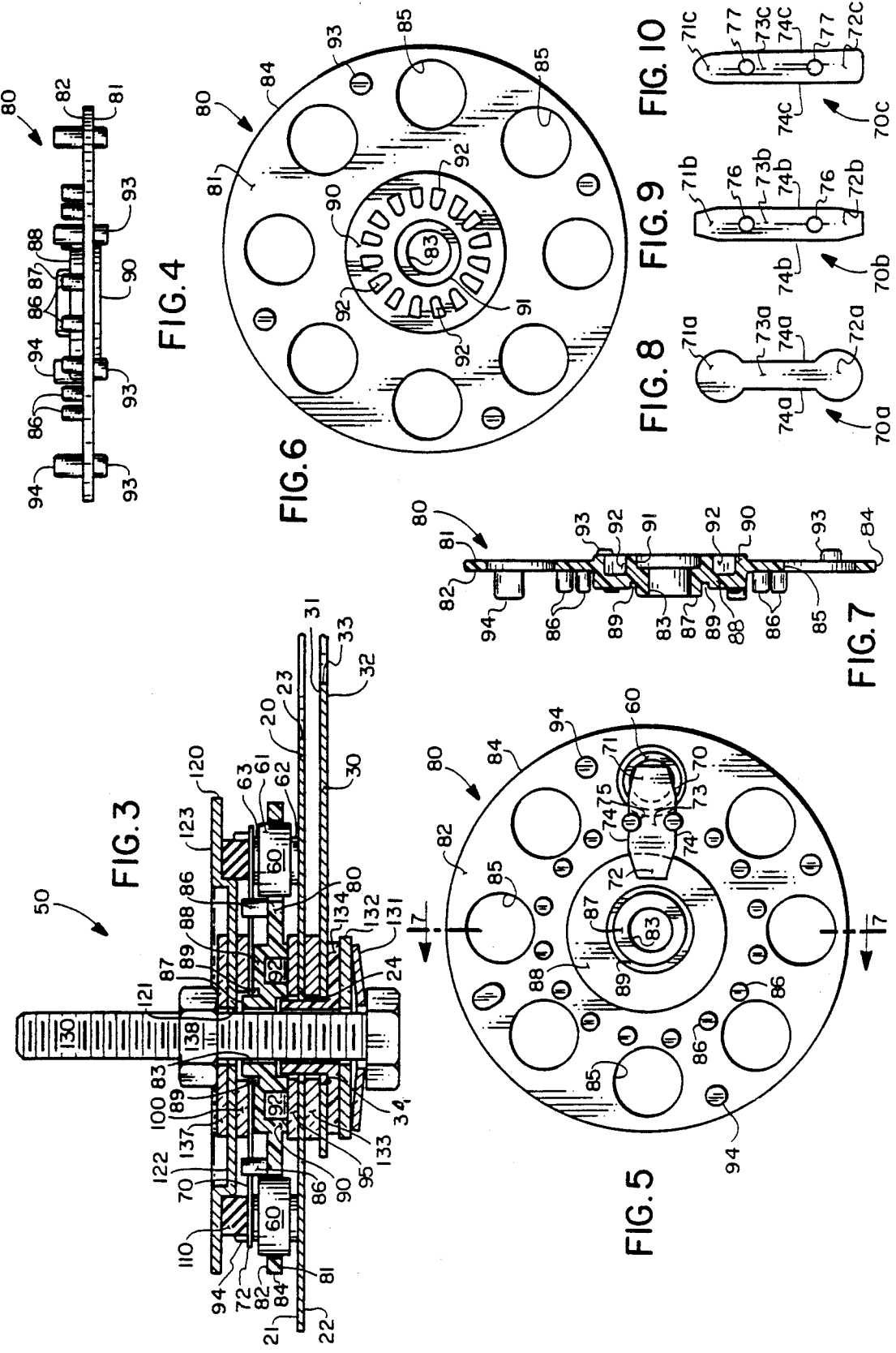

4,994,890

RECTIFIER STRUCTURE WITH INDIVIDUAL LINKS

BACKGROUND OF THE INVENTION

Rectifier structure is commonly utilized for connecting a plurality of semiconductor diodes in parallel in order to obtain a high-current-handling capacity which cannot be obtained with a single diode. When the diodes are connected in this manner, they must be matched in characteristics to avoid imbalances in the amount of current conducted by the individual diodes. Imbalances of current flow can result in a diode carrying more than its proportionate share of the current which, in turn, can result in a thermal-runaway condition, that is, a condition in which the temperature and conductance of the diode increases thereby causing it to pass an even greater part of the current of the rectifier structure.

Once a thermal-runaway condition has been reached, the increase in temperature and current flow through the individual diode will eventually destroy that diode. In some circumstances, the destruction of an individual diode results in a short circuit in that particular diode and renders the entire rectifier inoperative.

One rectifier structure comprised of individual diodes is disclosed in U.S. Pat. No. 4,554,574 to Wright. A plate electrically interconnects the anodes and a current-regulating plate interconnects the cathodes. The current-regulating plate includes a central conduction area, a plurality of link areas, and a plurality of diode-contact areas. In the event of excessive current flow through a particular diode, the associated link area opens. A disadvantage of this structure is that it requires the replacement of the entire current-regulating plate once a link area opens.

The Wright structure further includes an insulated diode spacer having a plurality of holes for the diodes, an insulated ring against the current regulating plate links to keep the link areas in contact with the diodes, and a washer which forces the ring against the link areas.

Another disadvantage of the Wright structure is the need to carefully align the current-regulating plate such that its diode-contact areas are firmly connected to the diodes. Also, the diode spacer is not compressible.

SUMMARY OF THE INVENTION

Accordingly, it is a general object of the present invention to provide a rectifier structure which avoids the disadvantages of prior rectifier structures while affording additional structural advantages.

Another object is to alleviate the need of replacing an entire current-regulating plate once one of its link areas has opened due to excessive current flow through one of the diodes.

Another object is to provide a rectifier structure having links which are automatically aligned against the diodes.

Another object is to provide a rectifier structure comprising an insulated ring automatically aligned against the links.

Another object is to provide a diode retainer which is compressed during assembly.

In summary, there is provided a rectifier structure comprising a plurality of diodes, each of the diodes including a body and opposed first and second terminals, first means for electrically connecting the first terminals to one another, the diodes being arranged on the first means in a circular pattern, a plurality of individual links, each link including inner and outer end portions and a fuse portion therebetween, retainer means for locating the diodes and the links on the first means, the links being located on the retainer means such that the outer end portion of each of the links contacts said second terminals, and second means in contact with the inner end portion of each of the links for electrically connecting the second terminals to one another.

The invention consists of certain novel features and a combination of parts hereinafter fully described, illustrated in the accompanying drawings, and particularly pointed out in the appended claims, it being understood that various changes in the details may be made without departing from the spirit, or sacrificing any of the advantages of the present invention.

BRIEF DESCRIPTION OF THE DRAWINGS

For the purpose of facilitating an understanding of the invention, there is illustrated in the accompanying drawings a preferred embodiment thereof, from an inspection of which, when considered in connection with the following description, the invention, its construction and operation, and many of its advantages should be readily understood and appreciated.

FIG. 3 is an enlarged, cross-sectional view of one rectifier, taken along the line 3—3 of FIG. 2;

FIG. 4 is a side-elevational view of the diode retainer incorporated in the rectifier structure;

FIG. 5 is a plan view of one of the surfaces of the diode retainer;

FIG. 6 is a plan view of the other of the surfaces of the diode retainer;

FIG. 7 is a cross-sectional view of the diode retainer, taken along the line 7—7 of FIG. 5;

FIG. 8 is a plan view of an alternate embodiment of a link in the rectifier structure;

FIG. 9 is a plan view of another embodiment of the link; and

FIG. 10 is a plan view of another embodiment of the link.

DETAILED DESCRIPTION OF THE PREFERRED EMBODIMENTS

Figure 1:
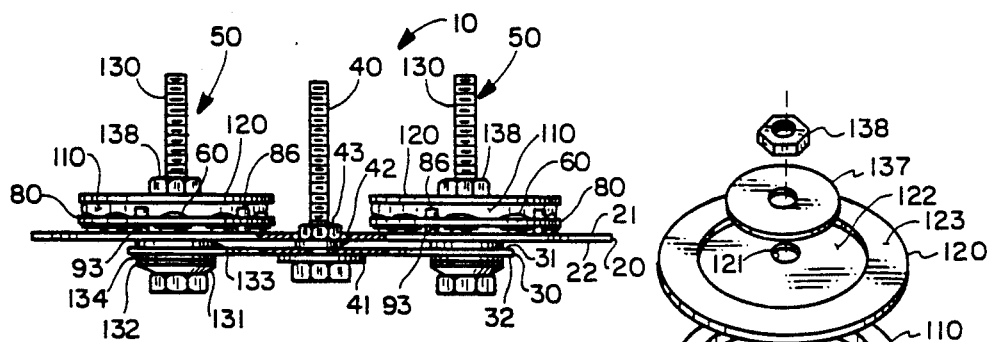
FIG. 1 is side elevational view of a rectifier structure constructed in accordance with the features of the present invention.
Figure 2:
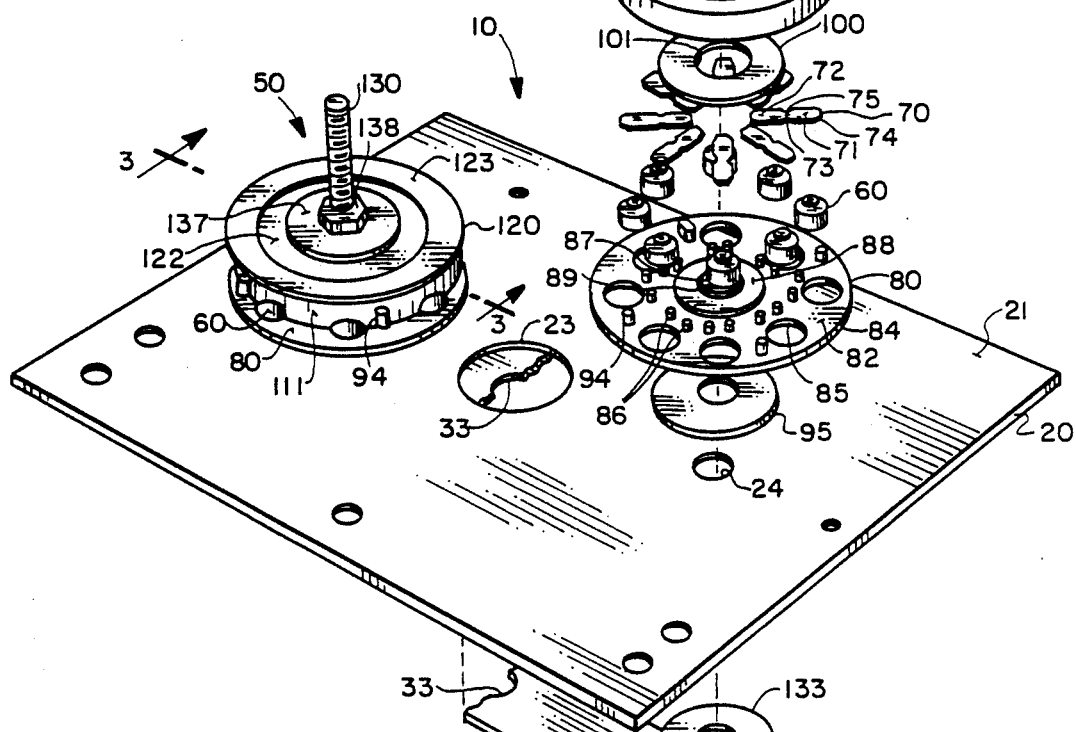
FIG. 2 is an enlarged, perspective view of one of the two rectifiers of the rectifier structure and an exploded view of the other rectifier.
Figure 2:
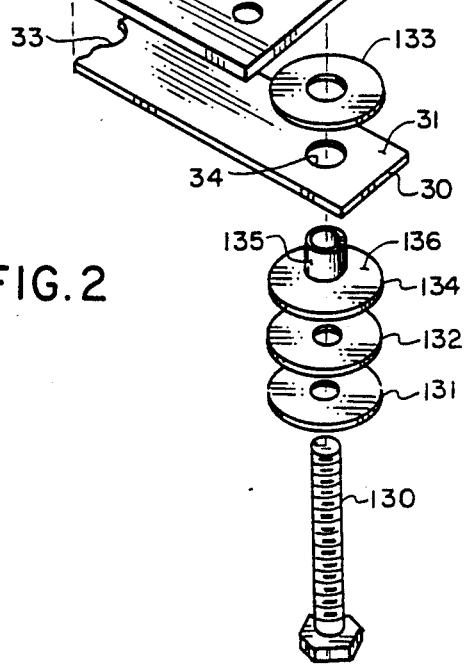

Turning now to the drawings and more particularly to FIGS. 1–3 thereof, there is depicted a rectifier structure 10 constructed in accordance with the present invention. The rectifier structure 10 comprises a plate 20 including opposed surfaces 21 and 22, a central opening 23 and a pair of further openings 24. A bar 30 is in electrical contact with the plate 20 and includes opposed surfaces 31 and 32, a central opening 33, and a pair of further openings 34. As shown in FIG. 2, the central openings 23 and 33 in plate 20 and bar 30 are aligned as are the further openings 24 and 34.

A rod, in the form of a bolt 40, passes through a washer 41, the central opening 33, a washer 42, the central opening 23, and is fastened to the plate 30 with a nut 43. The bolt 40 is also in electrical contact with the bar 30, and thereby provides a first main terminal to the rectifier structure 10.

The rectifier structure 10 comprises a pair of rectifier subassemblies 50. Each subassembly comprises eight diodes 60 arranged on the surface 21 of the plate 20 in a circular pattern around each opening 24. Each diode 60 includes a body 61 (FIG. 3), an anode terminal 62 and a cathode terminal 63. The plate 20 electrically connects the anode terminals 62 to one another.

Each rectifier subassembly 50 further comprises a plurality of individual spring biased links 70. Referring to FIG. 5, each link 70 includes an outer end portion 71, an inner end portion 72 and a fuse portion 73 therebetween. Each link 70 further includes opposed sides 74 having notches 75 formed in the region of the fuse portion 73. As a result, the fuse portion 73 defines an area of reduced cross-sectional area. In the embodiment depicted in FIG. 5, each end has tapered sides.

Alternate embodiments of the link 70 are depicted in FIGS. 8-10. In FIG. 8, a link 70a includes substantially circular end portions 71a and 72a and an elongated rectangular fuse portion 73a therebetween. The link 70a further includes opposed sides 74a. The fuse portion 73a defines an area of reduced cross-sectional area. In FIG. 9, a link 70b includes tapered end portions 71b and 72b and an elongated rectangular fuse portion 73b therebetween. A pair of longitudinally spaced openings 76 are located in the fuse portion 73b to define areas of reduced cross section. The link 70b further includes opposed sides 74b. In FIG. 10, a link 70c includes curved end portions 71c and 72c and an elongated fuse portion 73c therebetween. A pair of longitudinally spaced openings 77 are located in the fuse portion 73c to define areas of reduced cross section. The link 70c further includes opposed sides 74c.

Referring to FIGS. 4-7, each rectifier subassembly 50 further comprises a circular retainer 80 including opposed surfaces 81 and 82, a central opening 83, a peripheral edge 84, and eight circular openings 85 which are located adjacent the peripheral edge 84 and which are sized to receive the diodes 60. The retainer 80 further includes a plurality of bosses 86 arranged on the surface 82 (FIG. 5). The bosses are arranged in pairs respectively associated with the openings 85. Each pair of bosses 86 is arranged adjacent a side of the associated opening 85 opposite the side adjacent the peripheral edge 84. Each pair of bosses 86 is arranged in spaced relationship to receive a respective link 70.

Protruding from the surface 82 of the retainer 80 is a centrally located neck 87 which extends circumferentially around the central opening 83. A collar 88 extends circumferentially around the neck 87 and is separated therefrom by a circumferentially extending groove 89. The neck 87 protrudes from the surface 82 a distance greater than the collar 88.

Protruding from the surface 81 of the retainer 80 is a collar 90 having an outer diameter equal to the outer diameter of the collar 88 on the surface 82. The collar 90 protrudes from the surface 81 a distance less than that which the collar 88 protrudes from the surface 82. The collar 90 has an inner edge 91 extending circumferentially around the central opening 83. A plurality of recesses 92, formed in the collar 90, protrude through the surfaces 81 and 82 and into the collar 88 on the surface 82.

Finally, the retainer 80 includes a plurality of peripheral bosses 93 on the surface 81 and a plurality of peripheral bosses 94 on the surface 82. The bosses 93 and 94 are located adjacent the peripheral edge 84. One of the bosses 94 on the surface 82 is larger than the other bosses 94 as a result of the placement, at that location, of the gate for the mold of the retainer 80.

In the embodiment shown, the peripheral openings 85, the bosses 86, the plurality of recesses 92, the peripheral bosses 93, and the peripheral bosses 94 are all equiangularly spaced on the retainer 80. Further, in the embodiment shown, the retainer 80 is molded plastic.

Referring to FIG. 3, a washer 95 is disposed between the collar 90 and the plate 20. The bosses 93 (FIG. 4) contact the surface 21 of the plate 20. The diodes 60 are located in the openings 85 such that the anode terminals 62 contact the surface 21. Each pair of bosses 86 is located in the notches 75 of the associated link 70 (FIG. 5). The outer end portion 71 of each link 70 rests on the cathode terminal 63 of the associated diode while the inner end portion 72 of each link 70 is positioned against the collar 88 of the retainer 80. The bosses 86 automatically align the links 70 over the diodes 60 and eliminate the risk of misalignment which could occur during use of the structure. Each of the bosses 86 protrudes from the surface 82 a distance above the plane of an associated link 70 to assure that the bosses 86 remain located in the notches 75.

Although not shown in any of the figures, it is understood that the links 70a, 70b, and 70c, would be located on the retainer 80 in a similar fashion such that respective opposed sides 74a, 74b, and 74c abut the pair of bosses 86. When located in such a manner, the end portions 71a, 71b, and 71c, respectively, would rest on the cathode terminal 63 of an associated diode while the end portions 72a, 72b, and 72c, respectively, would be positioned against the collar 88 of the retainer 80.

A pressure washer 100 (FIGS. 2 and 3) having an opening 101 is positioned against the inner end portion 72 of each link 70 positioned against the collar 88. The pressure, through the links 70, electrically connects the cathode terminals 63 of the diodes 60 to one another.

A rubber ring 110 (FIGS. 2 and 3) having an outer surface 111 engages against the outer end portions 71 of links 70. The outer surface 111 engages against the peripheral bosses 94 which serve to automatically align the ring 110 and eliminate the risk of misalignment which could occur during use of the structure. The bosses 94 protrude from the surface 82 a distance substantially equal to the thickness of the outer surface 111 of the rubber ring 110 to provide a secure fit.

A pressure plate 120 (FIGS. 2 and 3) includes a central opening 121, a dished central portion 122 and a flange portion 123. The flange portion 123 is positioned against the ring 110 and the central portion 122 is positioned against the pressure washer 100. The pressure washer 100 is in electrical contact with the plate 120.

A rod, in the form of a bolt 130, fastens the various parts of each rectifier subassembly 50 (FIG. 2). Also included are a spring 131, preferably of the Belleville type, and washers 132 and 133. Additionally included is an insulator bushing 134 having a collar 135 and a radially extending flange 136. The bushing 134 is disposed between the bar 30 and the washer 132 such that one side of the flange 136 engages against the surface 32 of the bar 30 while the other side of the flange 136 engages against the surface of the washer 132. When disposed in such manner, the collar 135 extends through the bar 30, the washer 133, the plate 20, and the washer 95 disposed on the surface 21.

The bolt 130 passes through the spring 131, the washer 132, the insulator bushing 134, the bar 30, the washer 133, the plate 20, the washer 95, the retainer 80, the pressure washer 100, and the pressure plate 120. The bolt 130 is fastened with a washer 137 and a nut 138. When the various parts of the rectifier subassembly 50 are fastened together, the insulator bushing 134 serves to electrically insulate the bolt 130, the spring 131, and the washer 132 from the bar 30 and the washer 133. In addition to providing means for fastening the various parts of each rectifier subassembly 50, each bolt 130 serves as a second main terminal in electrical contact with the pressure plate 120.

The flange portion 123 of the plate 120 exerts pressure against the ring 110 in response to the tightening of the nut 138 on the bolt 130. As a result, the ring 110 serves to hold the outer end portion 71 of the links 70 respectively in contact with the cathode terminals 63 and, additionally, serves to hold the anode terminals 61 in contact with the plate 20. In a like manner, the dished central portion 122 exerts pressure against the pressure washer 100. The pressure applied against the pressure washer 100 is transferred to the inner end portion 72 of each of the links 70 which, in turn, is transferred to the retainer 80. Since the retainer 80 is made of plastic, it will be compressed in response to the pressure applied against the pressure washer 100 and the inner end portion 72 of each of the links 70. The compressibility of the retainer 80 is advantageous since it allows the inner end portion 72 of each of the links 70 to remain in firm contact with the pressure washer 100 irrespective of the varying tolerances, geometries, or defects of each of the links 70.

The rectifier structure 10 is utilized for connecting a plurality of diodes 60 in parallel in order to obtain a current capacity which cannot be obtained with a single diode 60. Current flows in each of the rectifier subassemblies 50 through the bolt 130, the nut 138, the washer 137, the pressure plate 120, the pressure washer 100, through each of the links 70, and then into each of the diodes 60.

The links 70 serve to regulate current in the individual diodes 60 by acting to balance currents in each diode 60. Additionally, the links 70 function as fuses for disconnecting particular individual diodes 60 in the event of excessive current flow.

Due to the reduced cross-sectional area of the fuse portion 73 of each link 70, the resistance of the link 70 at the fuse portion 73 is relatively higher than the electrical resistance at the outer and inner end portions 71 and 72. If an individual diode 60 is conducting increased current, the associated link 70 will melt. Since the diode 60 which conducted the excessive current is then electrically isolated from the other diodes 60, the rectifier structure 10 can operate with the remaining diodes 60. An individual link 70 which has melted can be replaced.

The links 70a, 70b, and 70c will melt in a similar fashion due to the reduced cross-sectional area of the fuse portions 73a, 73b, and 73c.

What has been described therefore is an improved diode rectifier structure. While particular embodiments of this invention have been described, it is to be understood that changes can be made in such embodiment without departing from the spirit or scope of the invention as defined in the claims.

What is claimed is:

1. A rectifier structure comprising: a plurality of diodes each including a body and opposed first and second terminals, first means for electrically connecting said first terminals to one another, said diodes being arranged on said first means in a circular pattern, a plurality of individual links including inner and outer end portions and a fuse portion therebetween, said inner end portions respectively of said links being physically separate from one another, retainer means for locating said diodes on said first means and for locating said links such that said outer end portion of each of said links contacts the associated one of said second terminals, and second means in contact with said inner end portion of each of said links for electrically connecting said second terminals to one another.

2. The rectifier structure of claim 1, wherein said first means is a plate.

3. The rectifier structure of claim 1, wherein said retainer means includes a plurality of peripheral openings, said diodes being respectively located within said peripheral openings.

4. The rectifier structure of claim 3, wherein said peripheral openings are equiangularly spaced.

5. The rectifier structure of claim 1, wherein said retainer means includes opposed surfaces, a plurality of peripheral openings, and a plurality of bosses arranged in pairs on one of the opposed surfaces, said pairs being respectively adjacent said peripheral openings and said links being respectively located between said pairs of bosses.

6. The rectifier structure of claim 5, wherein each of said links includes opposed sides, each of said sides having a notch in the region of said fuse portion, each pair of bosses being respectively located in the notches of the associated link.

7. The rectifier structure of claim 1, wherein said retainer means includes opposed surfaces, one of said opposed surfaces having a plurality of peripheral bosses for spacing said retainer means from said first means.

8. The rectifier structure of claim 7, wherein said peripheral bosses are equiangularly spaced.

9. The rectifier structure of claim 1, wherein said second means is a pressure washer engaging against said inner end portion of each of said links.

10. The rectifier structure of claim 1, wherein said links are flat.

11. A rectifier structure comprising: a plurality of diodes, each of said diodes including a body and opposed first, and second terminals, first means for electrically connecting said first terminals to one another, said diodes being arranged on said first means in a circular pattern, a plurality of individual links including inner and outer end portions and a fuse portion therebetween, said inner end portions respectively of said links being physically separate from one another, retainer means for locating said diodes on said first means in a circular pattern and for locating said links such that said outer end portion of each of said links contacts the associated one of said second terminals, second means in contact with said inner end portion of each of said links for electrically connecting said second terminals to one another, third means for holding said outer end portion of each of said links in contact with the associated one of said second terminals and said first terminals in contact with said first means, and fourth means for applying pressure to said third means and said second means.

12. The rectifier structure of claim 11, wherein said retainer means includes opposed surfaces and a plurality of peripheral bosses on one of the opposed surfaces for locating said third means on said retainer means.

13. The rectifier structure of claim 12, wherein said third means is a resilient ring of insulating material.

14. The rectifier structure of claim 11, wherein said second means is a pressure washer engaging against said inner end portion of each of said links.

15. The rectifier structure of claim 11, wherein said fourth means is a pressure plate.

16. A rectifier structure, comprising: a plate including opposed surfaces, a central opening, and a pair of further openings, a bar in electrical contact with said plate including opposed surfaces, a central opening, and a pair of further openings, said central and further openings in said plate and said bar being aligned with each other, a first rod extending through said central opening in said plate and said bar, said first rod being in electrical contact with said bar, a second rod extending through each of said further openings in said bar and said plate, a plurality of diodes arranged on said plate around said second rod, each of said diodes including a body and opposed first and second terminals, said plate electrically connecting said first terminals to one another, a plurality of individual links, each link including inner and outer end portions, and a fuse portion therebetween, a retainer for locating said diodes and said links on said plate, said links being located on said retainer such that said outer end portion of each of said links contacts the associated one of said second terminals, first means in contact with said inner end portion of each of said links for electrically connecting said second terminals to one another, second means for holding said outer end portion of each of said links in contact with the associated one of said second terminals and said first terminals in contact with said plate, and third means for applying pressure to said second means and said first means, said third means holding said inner end portion of each of said links in contact with said first means, said third means being in electrical contact with said second rod.

17. The rectifier structure of claim 16, wherein said retainer includes a central opening, said second rod extending through said central opening of said retainer.

18. The rectifier structure of claim 16, wherein said first means is a pressure washer having a central opening, said second rod extending through said central opening of said pressure washer, said inner end portion of each of said links being in electrical contact with said pressure washer.

19. The rectifier structure of claim 16, wherein said second means is a resilient ring of insulating material engaging against said outer end portion of each of said links.

20. The rectifier structure of claim 16, wherein said third means is a pressure plate having a central opening, said second rod extending through said central opening, said pressure plate being in electrical contact with said second rod.

21. A rectifier structure comprising: a plurality of diodes, each of said diodes including a body and opposed first and second terminals, first means for electrically connecting said first terminals to one another, said diodes being arranged on said first means in a circular pattern, a plurality of individual links including inner and outer end portions and a fuse portion therebetween, retainer means including opposed surfaces and a central opening and a peripheral edge, said retainer means locating said diodes on said first means in a circular pattern, said links being arranged on said retainer means and spaced around said central opening, said retainer means locating said links such that said outer end portion of each of said links contacts the associated one of said second terminals adjacent said peripheral edge and said inner end portion of each of said links contacts said retainer means adjacent said central opening, second means in contact with said inner end portion of each of said links for electrically connecting said second terminals to one another, third means for holding said outer end portion of each of said links in contact with the associated one of said second terminals and said first terminals in contact with said first means, and fourth means for applying pressure to said third means and said second means, said retainer means being compressible in response to the application of pressure to said second means by said fourth means thereby allowing said inner end portion of each of said links to be held in firm contact with said second means.

22. The rectifier structure of claim 21, wherein said first means is a plate having an opening, said second means is a pressure washer having a central opening, and said fourth means is a pressure plate having a central opening.

23. The rectifier structure of claim 22, further comprising a rod extending through said opening in said plate and said retainer means and said pressure washer and said pressure plate, and a nut releasably secured on said rod for applying pressure to said pressure plate.

24. The rectifier structure of claim 21, wherein said third means is a resilient ring of insulating material engaging against said outer end portion of each of said links.

25. The rectifier structure of claim 21, wherein said retainer means is composed of compressible plastic.

* * * * *